(12) United States Patent
Inoto et al.

(10) Patent No.: US 10,658,321 B2
(45) Date of Patent: May 19, 2020

(54) SEMICONDUCTOR CHIP, METHOD FOR MANUFACTURING SEMICONDUCTOR CHIP, INTEGRATED CIRCUIT DEVICE, AND METHOD FOR MANUFACTURING INTEGRATED CIRCUIT DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Hidekazu Inoto, Tokyo (JP); Akira Kimitsuka, Ichihara Chiba (JP); Takeshi Yamamoto, Kawasaki Kanagawa (JP); Mariko Habu, Tokyo (JP); Kanji Osari, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/920,780

(22) Filed: Mar. 14, 2018

(65) Prior Publication Data
US 2019/0088612 A1 Mar. 21, 2019

(30) Foreign Application Priority Data
Sep. 15, 2017 (JP) .................................. 2017-178268

(51) Int. Cl.
*H01L 23/00* (2006.01)
*H01L 21/78* (2006.01)
(Continued)

(52) U.S. Cl.
CPC .............. *H01L 24/15* (2013.01); *H01L 21/78* (2013.01); *H01L 23/485* (2013.01);
(Continued)

(58) Field of Classification Search
CPC .. H01L 23/488; H01L 23/49534; H01L 24/26
See application file for complete search history.

(56) References Cited

U.S. PATENT DOCUMENTS 5,533,664 A 7/1996 Sasaki et al.
5,606,198 A 2/1997 Ono et al.
(Continued)

FOREIGN PATENT DOCUMENTS

JP H10-209164 A 8/1998
JP 2809115 B2 10/1998
(Continued)

*Primary Examiner* — Eduardo A Rodela
(74) *Attorney, Agent, or Firm* — White & Case LLP

(57) ABSTRACT

An integrated circuit device includes a support substrate, a first semiconductor chip and a second semiconductor chip provided on the support substrate, and a connection member made of solder. The first semiconductor chip and the second semiconductor chip each includes a semiconductor substrate, an interconnect layer provided on the semiconductor substrate, and a pad provided on a side surface of the interconnect layer. The connection member contacts a side surface of the pad of the first semiconductor chip and a side surface of the pad of the second semiconductor chip.

8 Claims, 21 Drawing Sheets

(51) Int. Cl.
*H01L 25/065* (2006.01)
*H01L 23/482* (2006.01)
*H01L 23/485* (2006.01)
*H01L 23/488* (2006.01)

(52) U.S. Cl.
CPC ........ *H01L 23/488* (2013.01); *H01L 23/4824* (2013.01); *H01L 23/4855* (2013.01); *H01L 24/02* (2013.01); *H01L 24/03* (2013.01); *H01L 24/05* (2013.01); *H01L 24/10* (2013.01); *H01L 24/13* (2013.01); *H01L 24/16* (2013.01); *H01L 24/17* (2013.01); *H01L 24/81* (2013.01); *H01L 24/94* (2013.01); *H01L 24/97* (2013.01); *H01L 25/0655* (2013.01); *H01L 24/11* (2013.01); *H01L 2224/02313* (2013.01); *H01L 2224/02371* (2013.01); *H01L 2224/0345* (2013.01); *H01L 2224/0391* (2013.01); *H01L 2224/03612* (2013.01); *H01L 2224/03614* (2013.01); *H01L 2224/03901* (2013.01); *H01L 2224/0401* (2013.01); *H01L 2224/05008* (2013.01); *H01L 2224/05009* (2013.01); *H01L 2224/05082* (2013.01); *H01L 2224/05124* (2013.01); *H01L 2224/05166* (2013.01); *H01L 2224/05187* (2013.01); *H01L 2224/05548* (2013.01); *H01L 2224/05624* (2013.01); *H01L 2224/11312* (2013.01); *H01L 2224/1302* (2013.01); *H01L 2224/13023* (2013.01); *H01L 2224/13024* (2013.01); *H01L 2224/13026* (2013.01); *H01L 2224/13027* (2013.01); *H01L 2224/16106* (2013.01); *H01L 2224/16137* (2013.01); *H01L 2224/8121* (2013.01); *H01L 2224/81815* (2013.01); *H01L 2224/94* (2013.01); *H01L 2224/97* (2013.01); *H01L 2924/04941* (2013.01); *H01L 2924/13091* (2013.01); *H01L 2924/15738* (2013.01); *H01L 2924/15747* (2013.01)

(56) References Cited

U.S. PATENT DOCUMENTS

| | | | |
|---|---|---|---|
| 6,611,050 B1 * | 8/2003 | Ference | H01L 23/5388 257/678 |
| 7,915,736 B2 * | 3/2011 | Kirby | H01L 21/76868 257/774 |
| 9,209,143 B2 * | 12/2015 | Seidemann | H01L 24/09 |
| 9,214,391 B2 * | 12/2015 | Kirby | H01L 21/76898 |
| 2004/0070087 A1 * | 4/2004 | Wang | H01L 23/481 257/787 |
| 2004/0221451 A1 * | 11/2004 | Chia | H01L 21/6835 29/854 |
| 2004/0238926 A1 * | 12/2004 | Obinata | H01L 21/78 257/678 |
| 2010/0117224 A1 * | 5/2010 | McElrea | H01L 24/24 257/723 |
| 2018/0182709 A1 * | 6/2018 | Jaywant | H01L 23/49894 |

FOREIGN PATENT DOCUMENTS

| | | |
|---|---|---|
| JP | 2980495 B2 | 11/1999 |
| JP | 2003-188263 A | 7/2003 |
| JP | 2006-049699 A | 2/2006 |
| JP | 2007-207906 A | 8/2007 |

* cited by examiner

SEMICONDUCTOR CHIP, METHOD FOR MANUFACTURING SEMICONDUCTOR CHIP, INTEGRATED CIRCUIT DEVICE, AND METHOD FOR MANUFACTURING INTEGRATED CIRCUIT DEVICE

CROSS-REFERENCE TO RELATED APPLICATIONS

This application is based upon and claims the benefit of priority from Japanese Patent Application No. 2017-178268, filed on Sep. 15, 2017; the entire contents of which are incorporated herein by reference.

FIELD

Embodiments relate to a semiconductor chip, a method for manufacturing the semiconductor chip, an integrated circuit device, and a method for manufacturing the integrated circuit device.

BACKGROUND

Conventionally, an integrated circuit device has been manufactured in which multiple semiconductor chips are mounted on a support substrate, and these semiconductor chips are connected to each other. Normally, the semiconductor chips are connected to each other by wire bonding. However, higher integration of the integrated circuit device is obstructed because some amount of space is necessary to perform the wire bonding. Also, a faster integrated circuit device is obstructed because the resistance of the wires of the wire bonding is high.

DETAILED DESCRIPTION

An integrated circuit device according to one embodiment includes a support substrate, a first semiconductor chip and a second semiconductor chip provided on the support substrate, and a connection member made of solder. The first semiconductor chip and the second semiconductor chip each includes a semiconductor substrate, an interconnect layer provided on the semiconductor substrate, and a pad provided on a side surface of the interconnect layer. The connection member contacts a side surface of the pad of the first semiconductor chip and a side surface of the pad of the second semiconductor chip.

A method for manufacturing a semiconductor chip according to one embodiment includes forming an interconnect layer on a semiconductor substrate, subdividing the interconnect layer into a plurality of portions by forming a first trench in the interconnect layer, forming a metal film on an inner surface of the first trench, subdividing the metal film into a plurality of pads by forming a second trench in a bottom surface of the first trench, forming solder layers on two side surfaces of the first trench, the solder layers protruding into a region directly above the second trench, the solder layers not contacting each other, and subdividing the semiconductor substrate into a plurality of portions by polishing a lower surface of the semiconductor substrate to the second trench.

An embodiment of the invention will now be described.

First, an integrated circuit device according to the embodiment will be described.

Figure 1:
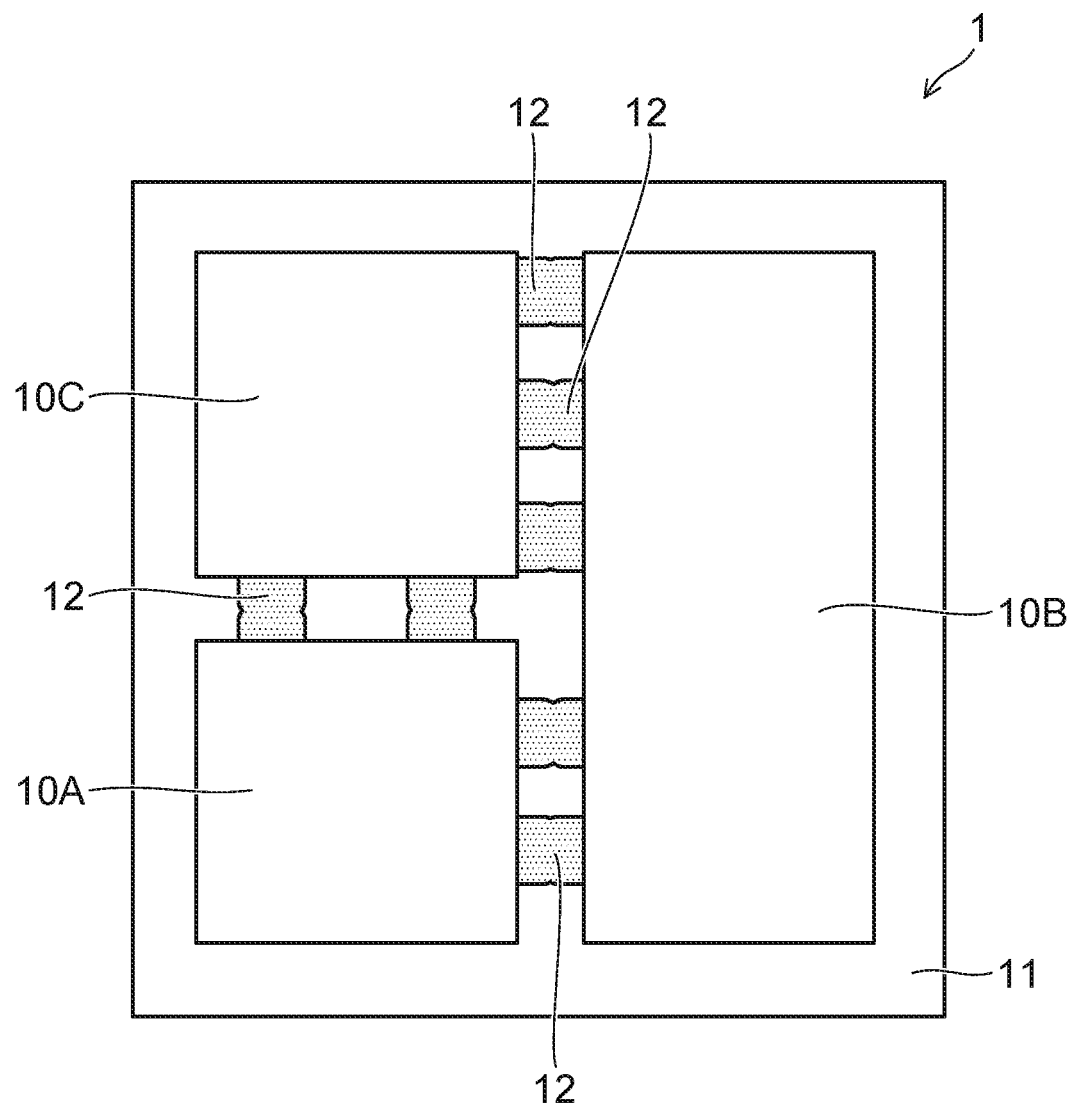
FIG. 1 is a plan view showing an integrated circuit device according to an embodiment.

FIG. 1 is a plan view showing the integrated circuit device according to the embodiment.

Figure 2:
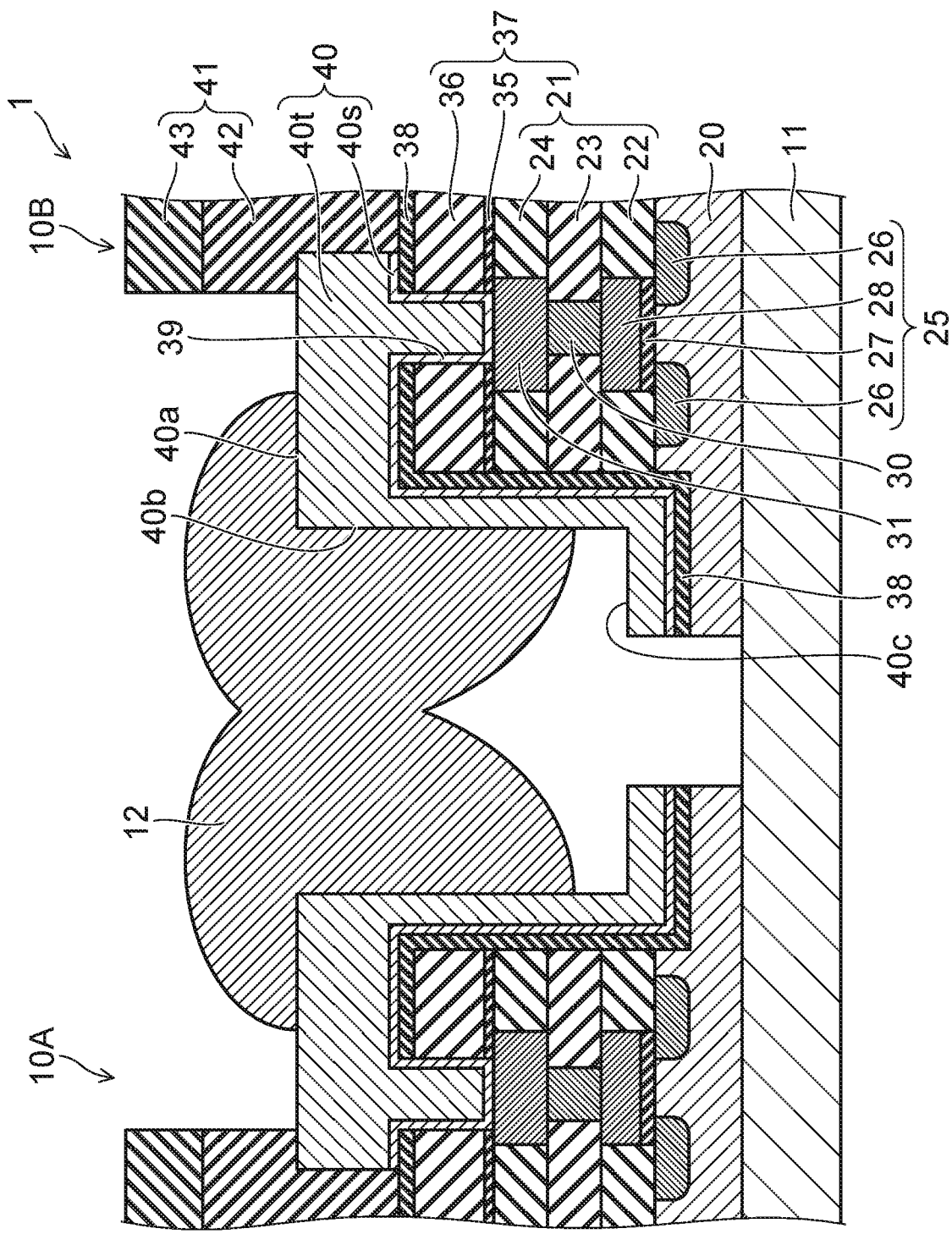
FIG. 2 is a partially enlarged cross-sectional view showing the integrated circuit device according to the embodiment.

FIG. 2 is a partially enlarged cross-sectional view showing the integrated circuit device according to the embodiment.

The drawings are schematic and are drawn with appropriate exaggerations or omissions. For example, the components are drawn to be larger and fewer than the actual components. The numbers, dimensional ratios, etc., of the components do not always match between the drawings.

As shown in FIG. 1, a support substrate 11 is provided in the integrated circuit device 1 according to the embodiment. For example, the support substrate 11 is formed of a metal such as gold (Au), copper (Cu), etc. Multiple, e.g., three semiconductor chips 10A to 10C are mounted on the support substrate 11. Multiple connection members 12 connect between the semiconductor chip 10A and the semiconductor chip 10B, between the semiconductor chip 10B and the semiconductor chip 10C, and between the semiconductor chip 10C and the semiconductor chip 10A. The connection members 12 are formed of solder.

As shown in FIG. 1 and FIG. 2, a silicon substrate 20 that is made of monocrystalline silicon (Si) is provided in each of the semiconductor chips 10A to 10C (hereinbelow, also generally referred to as the "semiconductor chips 10"). An interconnect layer 21 is provided on a portion of the silicon substrate 20 other than the end portion.

In the interconnect layer 21, for example, inter-layer insulating films 22, 23, and 24 that are made of silicon oxide (SiO) are stacked in this order. The number of stacks of inter-layer insulating films in the interconnect layer 21 is not limited to three. Circuit elements such as a transistor 25, etc., are formed inside the silicon substrate 20 and the interconnect layer 21. For example, a pair of impurity-including layers 26 is formed in the upper layer portion of the silicon substrate 20. A gate insulating film 27 that is made of, for example, silicon oxide is provided inside the inter-layer insulating film 22 in the region directly above the portion between the pair of impurity-including layers 26; and a gate electrode 28 that is made of, for example, a conductive material such as polysilicon or the like is provided on the gate insulating film 27. The transistor 25 is formed of the pair of impurity-including layers 26, the portion of the silicon substrate 20 between the pair of impurity-including layers 26, the gate insulating film 27, and the gate electrode 28.

A via 30 that is made of a metal material such as tungsten (W) or the like is provided in the inter-layer insulating film 23. An interconnect 31 that is made of a metal material such as tungsten or the like is provided inside the inter-layer insulating film 24. A portion of the interconnect 31 is connected to the gate electrode 28 by the via 30.

An etching stopper layer 35 that is made of, for example, silicon nitride (SiN) is provided on the interconnect layer 21; and an insulating film 36 that is made of, for example, silicon oxide is provided on the etching stopper layer 35. An insulating film 38 that is made of, for example, silicon nitride is provided to cover the upper surface of the end portion of the silicon substrate 20 and the upper surface and the side surface of a stacked body 37 made of the interconnect layer 21, the etching stopper layer 35, and the insulating film 36.

A via hole 39 is formed in the portion of the etching stopper layer 35, the insulating film 36, and the insulating film 38 disposed on the interconnect layer 21. When viewed from above, the configuration of the via hole 39 is, for example, a circle. The interconnect 31 is exposed at the bottom surface of the via hole 39.

A pad 40 that is made of a conductive material is provided on the upper surface of the end portion of the silicon substrate 20 and on the side surface and the upper surface of the end portion of the stacked body made of the interconnect layer 21, the etching stopper layer 35, the insulating film 36, and the insulating film 38. A diffusion prevention layer 40s is provided in the lower portion of the pad 40. The diffusion prevention layer 40s is, for example, a two-layer film of titanium (Ti) and titanium nitride (TiN). For example, a main portion 40t of the pad 40 other than the diffusion prevention layer 40s is formed of aluminum (Al). The pad 40 is disposed also inside the via hole 39 and is connected to the interconnect 31 at the bottom surface of the via hole 39. The silicon substrate 20 and the pad 40 are insulated by the insulating film 38.

A passivation film 41 is provided on a portion of the insulating film 38 that is on the insulating film 36. The passivation film 41 extends onto the end portion of the pad 40. A silicon oxide film 42 and a silicon nitride film 43 are stacked in the passivation film 41.

The connection member 12 that is made of solder contacts an upper surface 40a of the portion of the pad 40 disposed on the upper surface of the stacked body 37 and a side surface 40b of the portion of the pad 40 disposed on the side surface of the stacked body 37. On the other hand, the connection member 12 is separated from an upper surface 40c of the portion of the pad 40 disposed on the end portion of the silicon substrate 20. Thereby, the connection member 12 is linked in a bridge configuration between the mutually-opposing pads 40 of two mutually-adjacent semiconductor chips 10, e.g., the semiconductor chips 10A and 10B. As a result, the upper surface 40a and the side surface 40b of the pad 40 of the semiconductor chip 10A and the upper surface 40a and the side surface 40b of the pad 40 of the semiconductor chip 10B are connected to each other via the connection member 12.

The connection member 12 may be adhered over only the side surface 40b of the pad 40; or the connection member 12 may be adhered over the upper surface 40c in addition to the side surface 40b of the pad 40. Further, the connection member 12 may be adhered over the upper surface 40a, the side surface 40b, and the upper surface 40c of the pad 40.

A semiconductor chip according to the embodiment will now be described.

Figure 3:
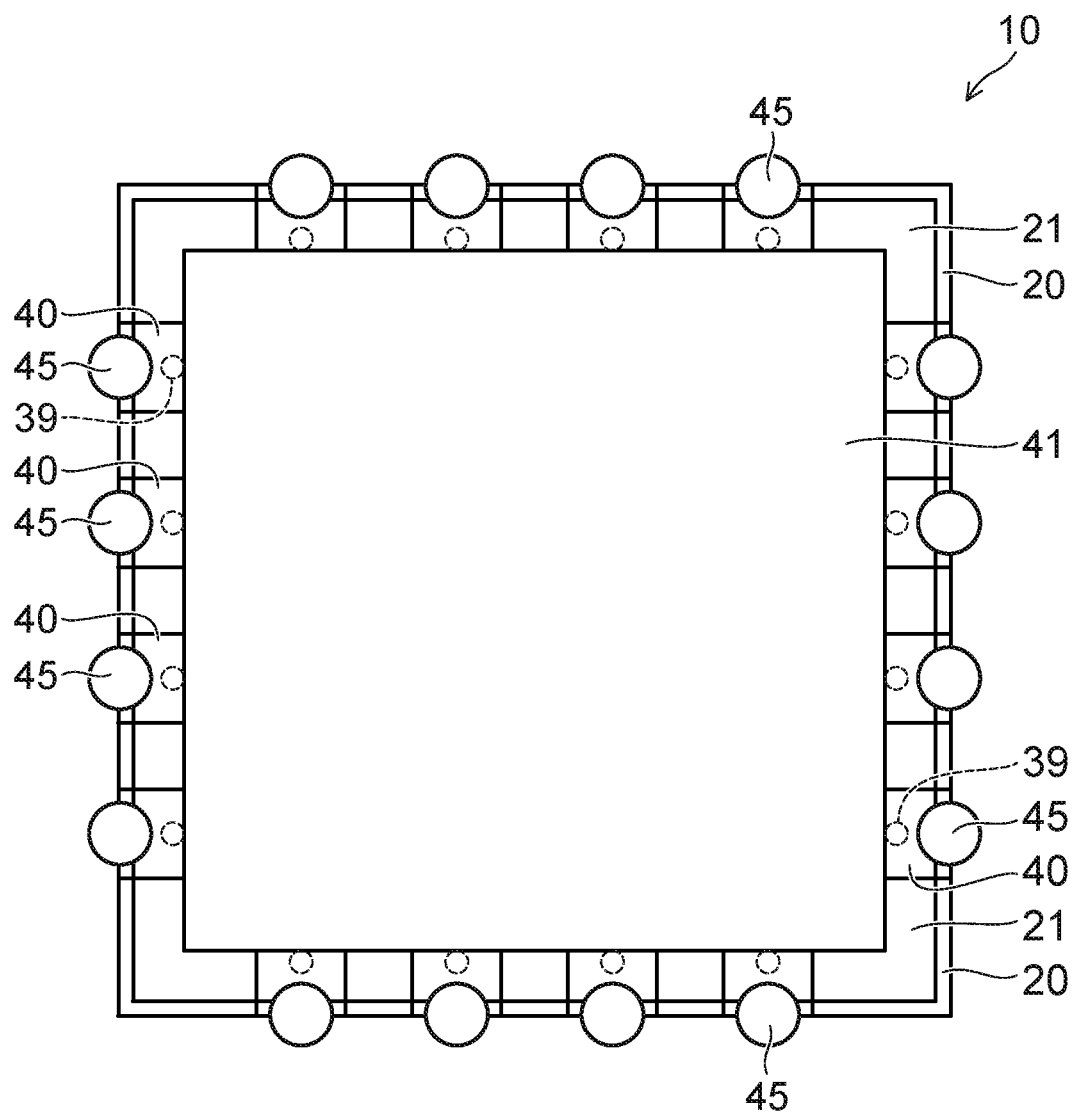
FIG. 3 is a plan view showing a semiconductor chip according to the embodiment.

FIG. 3 is a plan view showing the semiconductor chip according to the embodiment.

Figure 4:
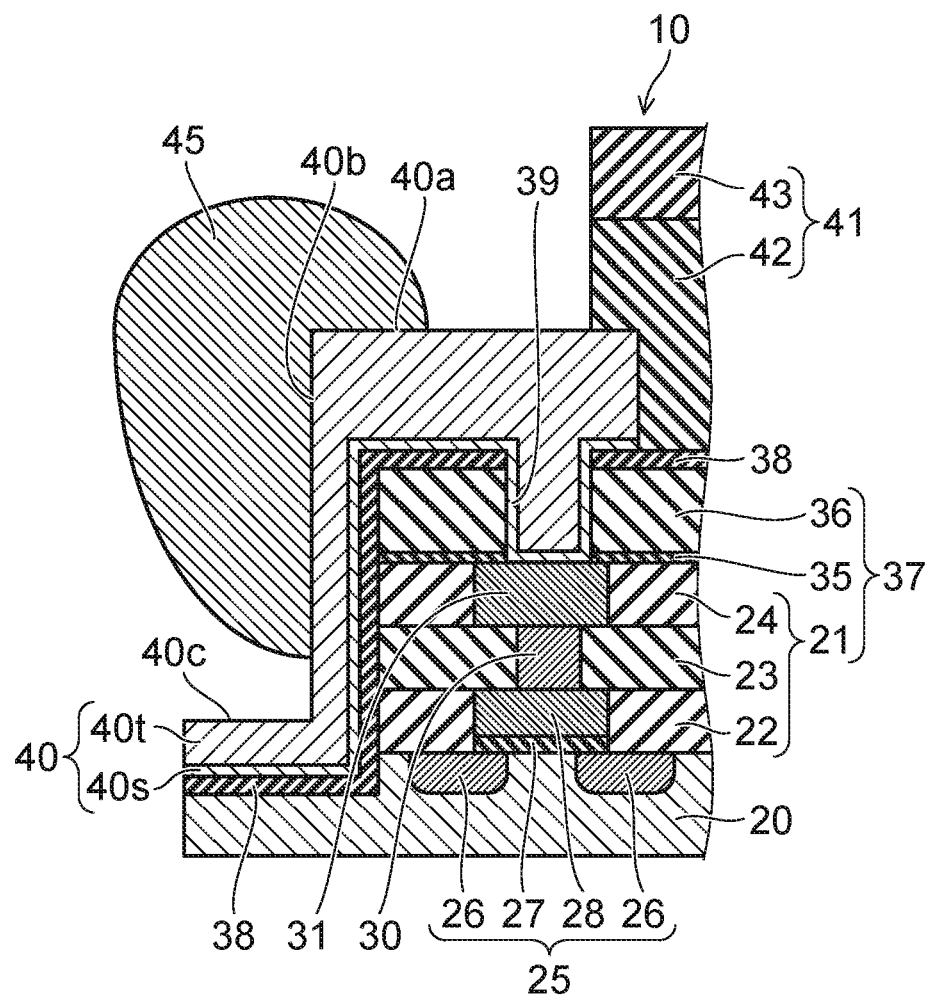
FIG. 4 is a partially enlarged cross-sectional view showing the semiconductor chip according to the embodiment.

FIG. 4 is a partially enlarged cross-sectional view showing the semiconductor chip according to the embodiment.

The semiconductor chip 10 described below is in the state of being mounted on the support substrate 11 before being connected to another semiconductor chip by the connection members 12.

In the semiconductor chip 10 as shown in FIG. 3 and FIG. 4, the interconnect layer 21 is disposed on a portion of the silicon substrate 20 other than the end portion. The multiple pad 40 are arranged along the end edge of the semiconductor chip 10. The pads 40 are provided on the end portion of the silicon substrate 20 and on the side surface and on the upper surface of the end portion of the interconnect layer 21. The pads 40 may be provided also on the central portion of the interconnect layer 21.

Solder layers 45 are provided on the upper surfaces 40a and on the side surfaces 40b of the pads 40. The configurations of the solder layers 45 are substantially hemispherical configurations, contact the upper surfaces 40a and the side surfaces 40b of the pads 40, and protrude further sideward than the side surface of the silicon substrate 20 and the side surface of the interconnect layer 21 at the side of the semiconductor chip 10. In other words, the tips of the protrusions of the solder layers 45 are the most protruding portions at the side surface of the semiconductor chip 10. Otherwise, the configuration of the semiconductor chip 10 is as described above.

A method for manufacturing the semiconductor chip according to the embodiment will now be described.

FIG. 5 to FIG. 20 are cross-sectional views showing the method for manufacturing the semiconductor chip according to the embodiment.

Figure 5:
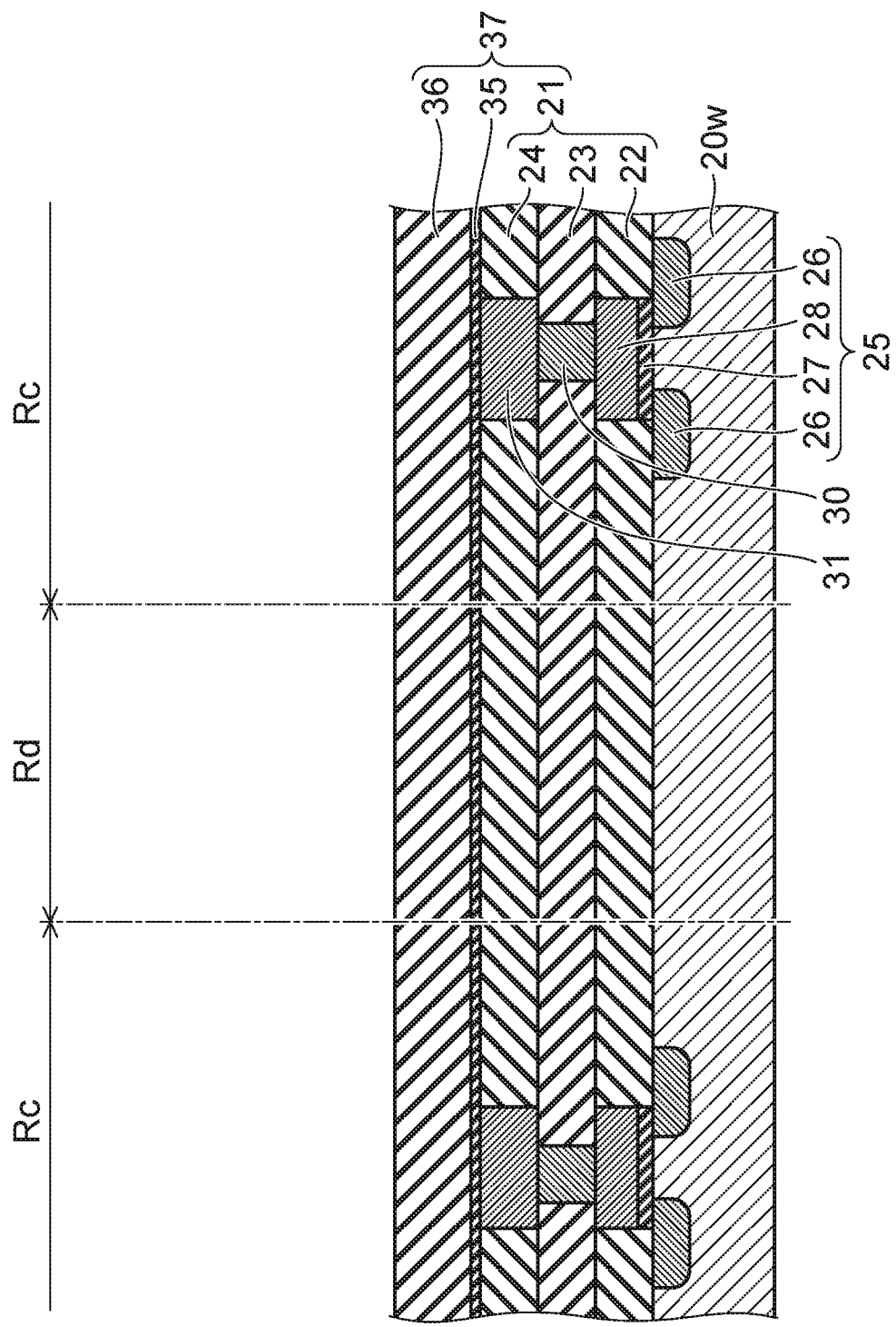
FIG. 5 to FIG. 20 are cross-sectional views showing a method for manufacturing the semiconductor chip according to the embodiment.

As shown in FIG. 5, a silicon wafer 20w is prepared as a semiconductor substrate. In the silicon wafer 20w, multiple chip regions Rc are set in a matrix configuration to be separated from each other; and a dicing region Rd that has a lattice configuration is set between the chip regions Rc.

First, the interconnect layer 21 is formed on the silicon wafer 20w by a normal method. The circuit elements such as the transistor 25, etc., the conductive members such as the via 30, the interconnect 31, etc., are formed inside the silicon wafer 20w and inside the interconnect layer 21. Then, the etching stopper layer 35 that is made of silicon nitride is formed on the interconnect layer 21; and the insulating film 36 that is made of silicon oxide is formed on the etching stopper layer 35. The stacked body 37 is formed of the interconnect layer 21, the etching stopper layer 35, and the insulating film 36.

Figure 6:
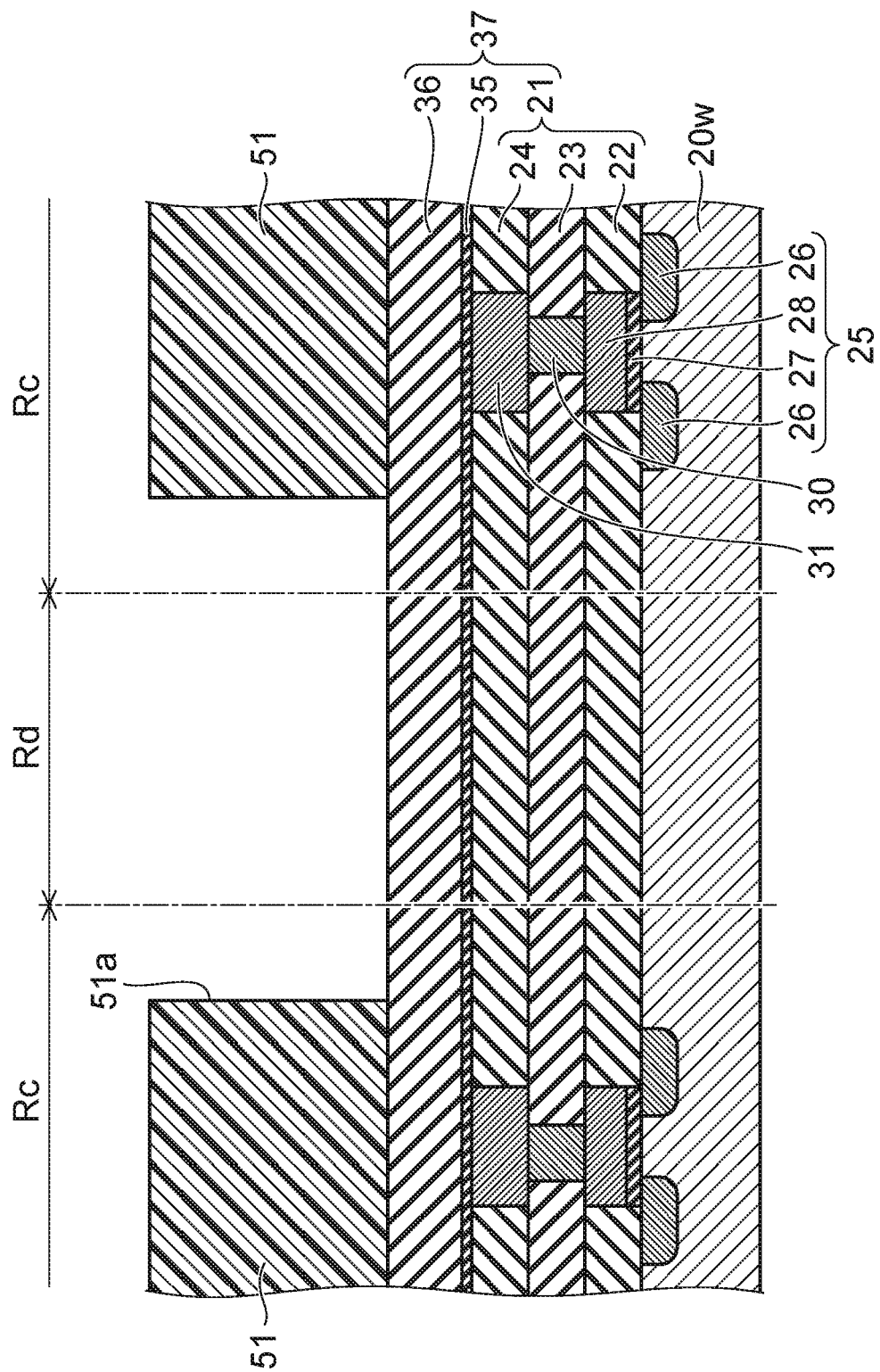

Continuing as shown in FIG. 6, a resist film 51 is formed on the stacked body 37. An opening 51a is formed in the resist film 51 in the entire dicing region Rd and in the end portions of the chip regions Rc. When viewed from above, the configuration of the opening 51a is a lattice configuration that is wider than the dicing region Rd.

Figure 7:
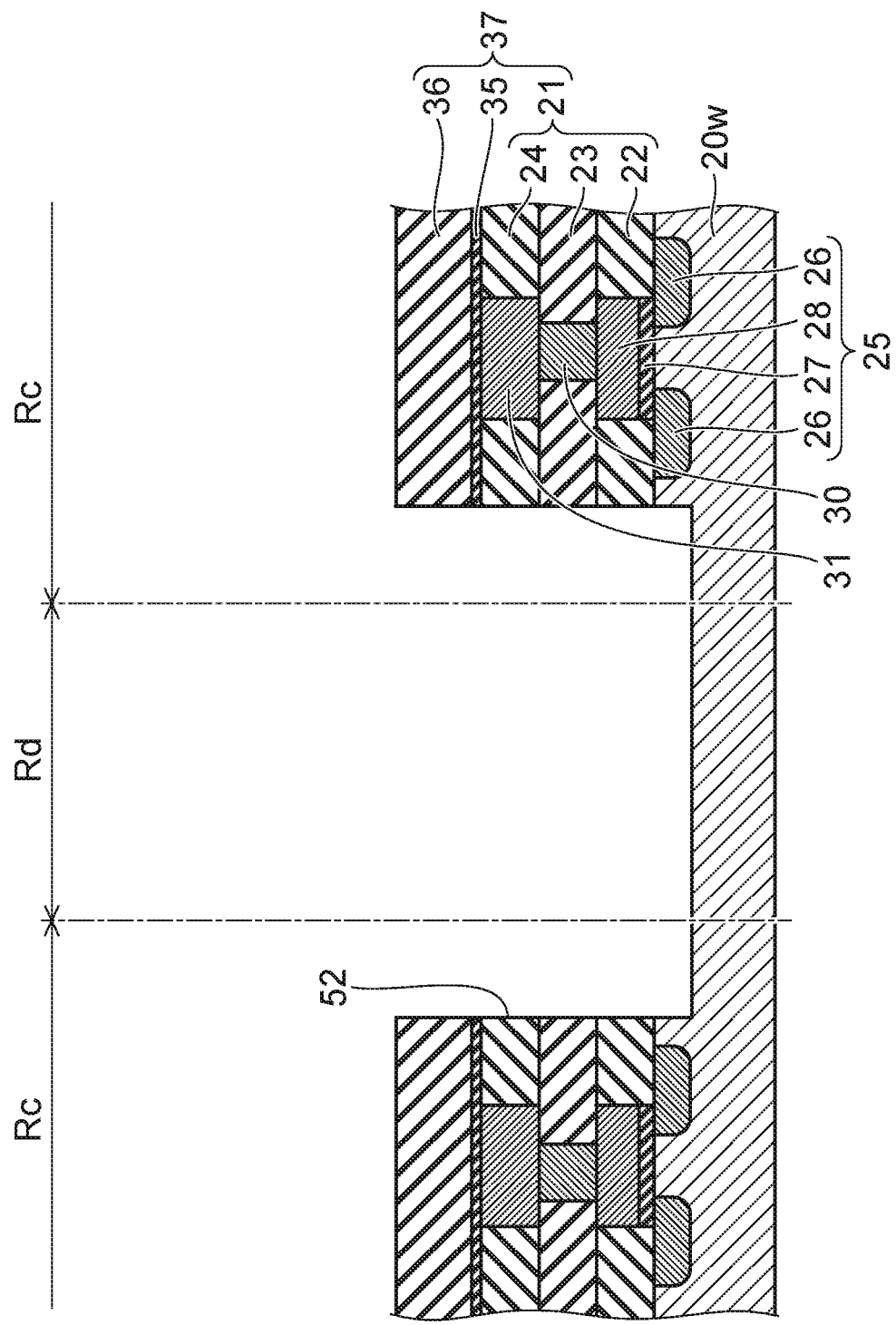

Then, as shown in FIG. 7, anisotropic etching such as RIE (Reactive Ion Etching) or the like is performed using the resist film 51 (referring to FIG. 6) as a mask. Thereby, a trench 52 is formed in the region directly under the opening 51a. The trench 52 pierces the stacked body 37 and enters the upper portion of the silicon wafer 20w. As a result, the interconnect layer 21 is subdivided every chip region Rc. Then, the resist film 51 is removed.

Figure 8:
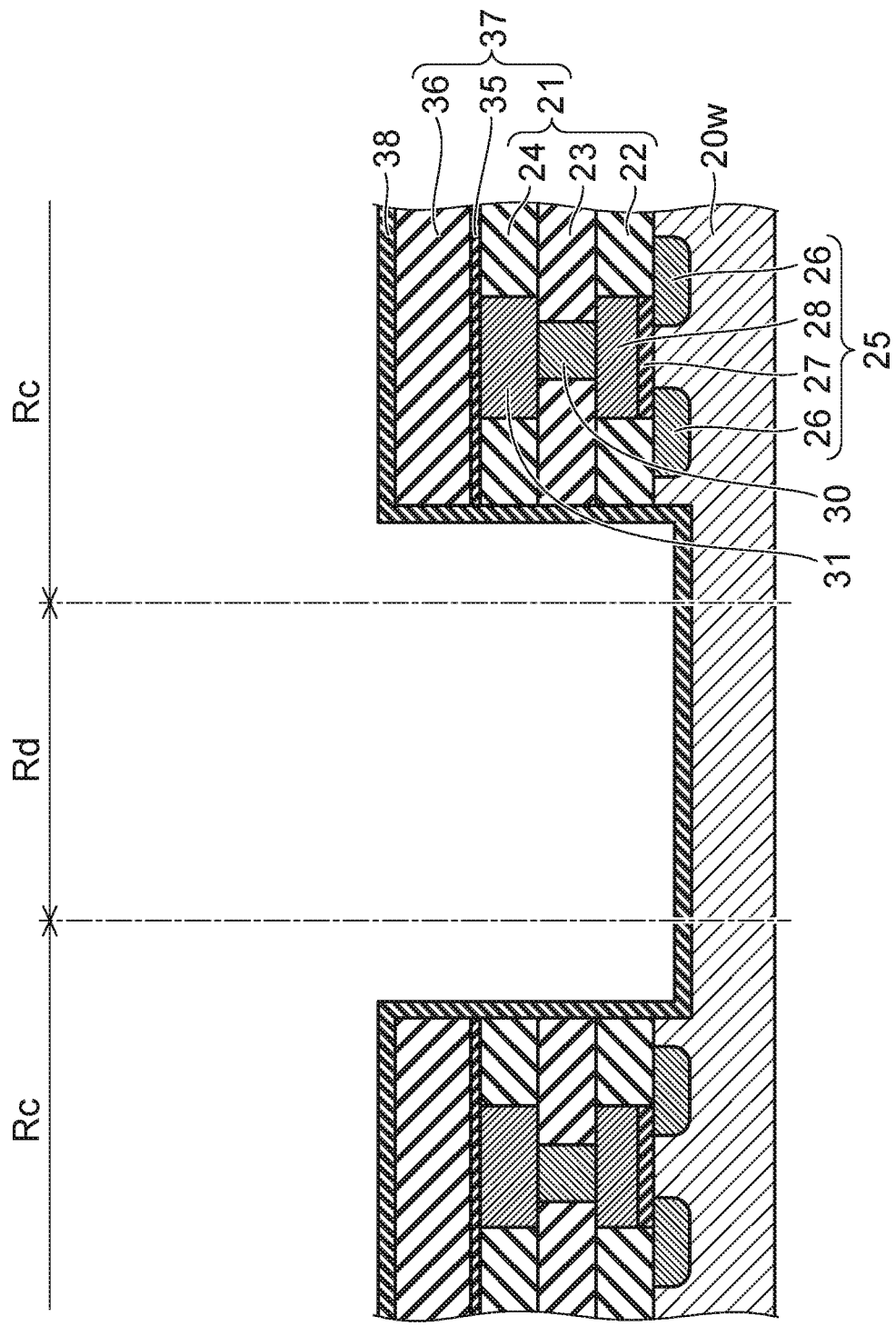

Continuing as shown in FIG. 8, for example, the insulating film 38 is formed on the entire surface by depositing silicon nitride. The insulating film 38 is formed also on the inner surface of the trench 52.

Figure 9:
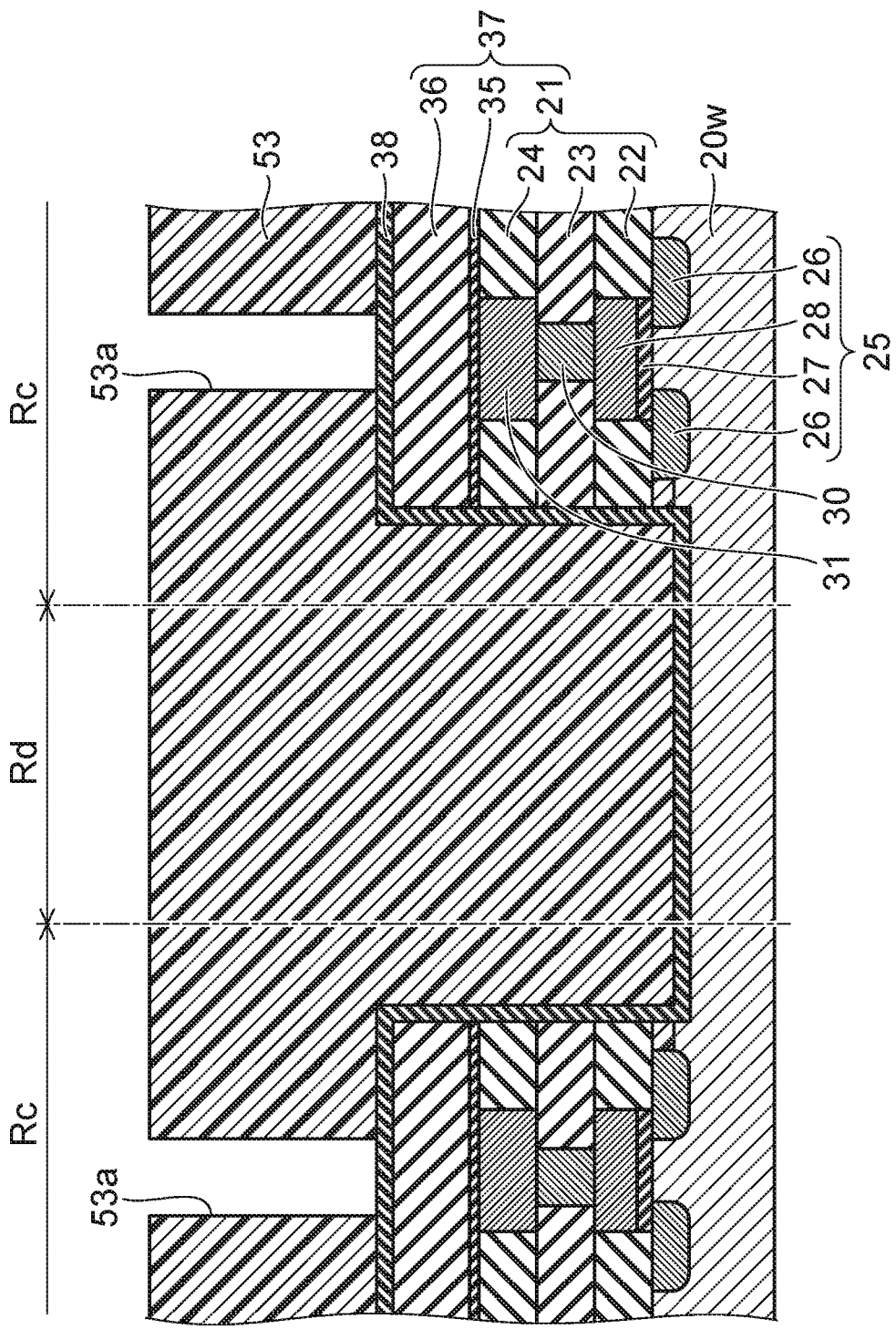

Then, as shown in FIG. 9, a resist film 53 is formed on the insulating film 38. An opening 53a is formed in the resist film 53 in a portion of the region directly above the stacked body 37. When viewed from above, the configuration of the opening 53a is set to be, for example, a circle. The opening 53a is multiply formed along the end edges of the chip regions Rc.

Figure 10:
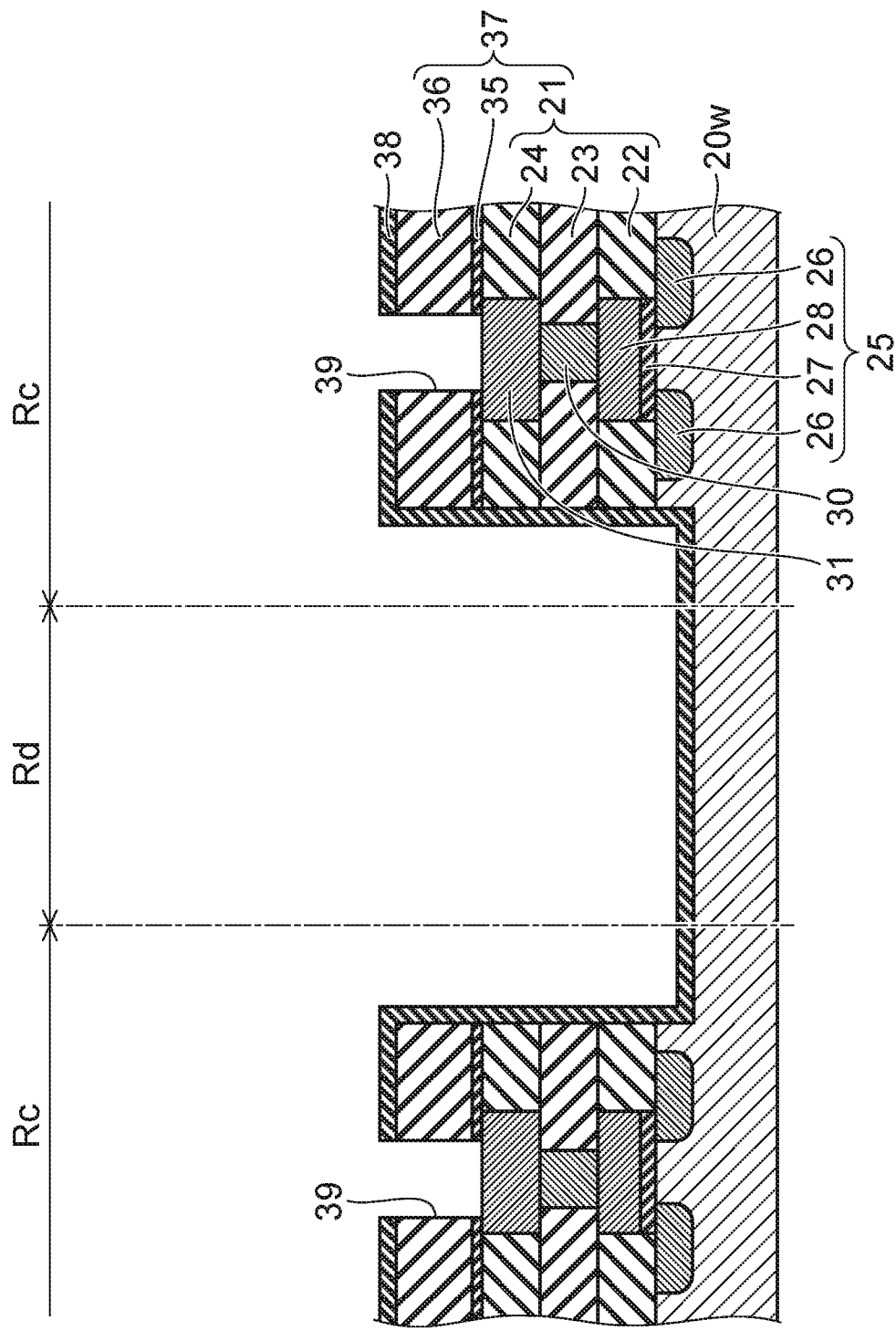

Then, as shown in FIG. 10, anisotropic etching such as RIE or the like is performed using the resist film 53 (referring to FIG. 9) as a mask and the etching stopper layer 35 as a stopper. Thereby, the via hole 39 is formed in the region directly under the opening 53a. The via hole 39 pierces the insulating film 38, the insulating film 36, and the etching stopper layer 35; and the interconnect 31 is exposed at the bottom surface of the via hole 39. Then, the resist film 53 is removed.

Figure 11:
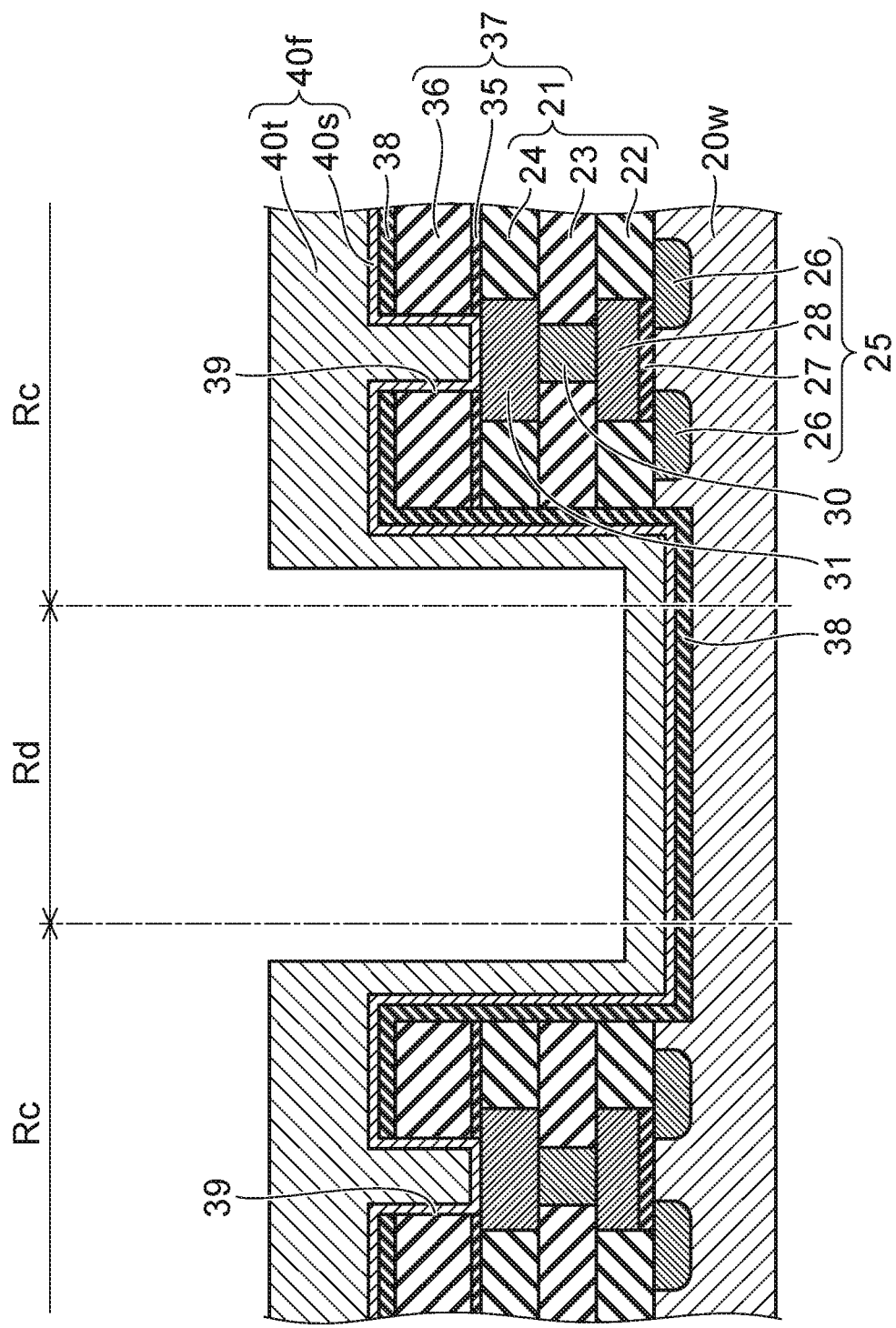

Continuing as shown in FIG. 11, for example, the diffusion prevention layer 40s is formed by depositing titanium nitride and titanium by sputtering. Then, for example, the main portion 40t is formed by depositing aluminum by sputtering. A metal film 40f is formed of the diffusion prevention layer 40s and the main portion 40t. The metal film 40f is filled also into the via hole 39 and is connected to the interconnect 31.

Figure 12:
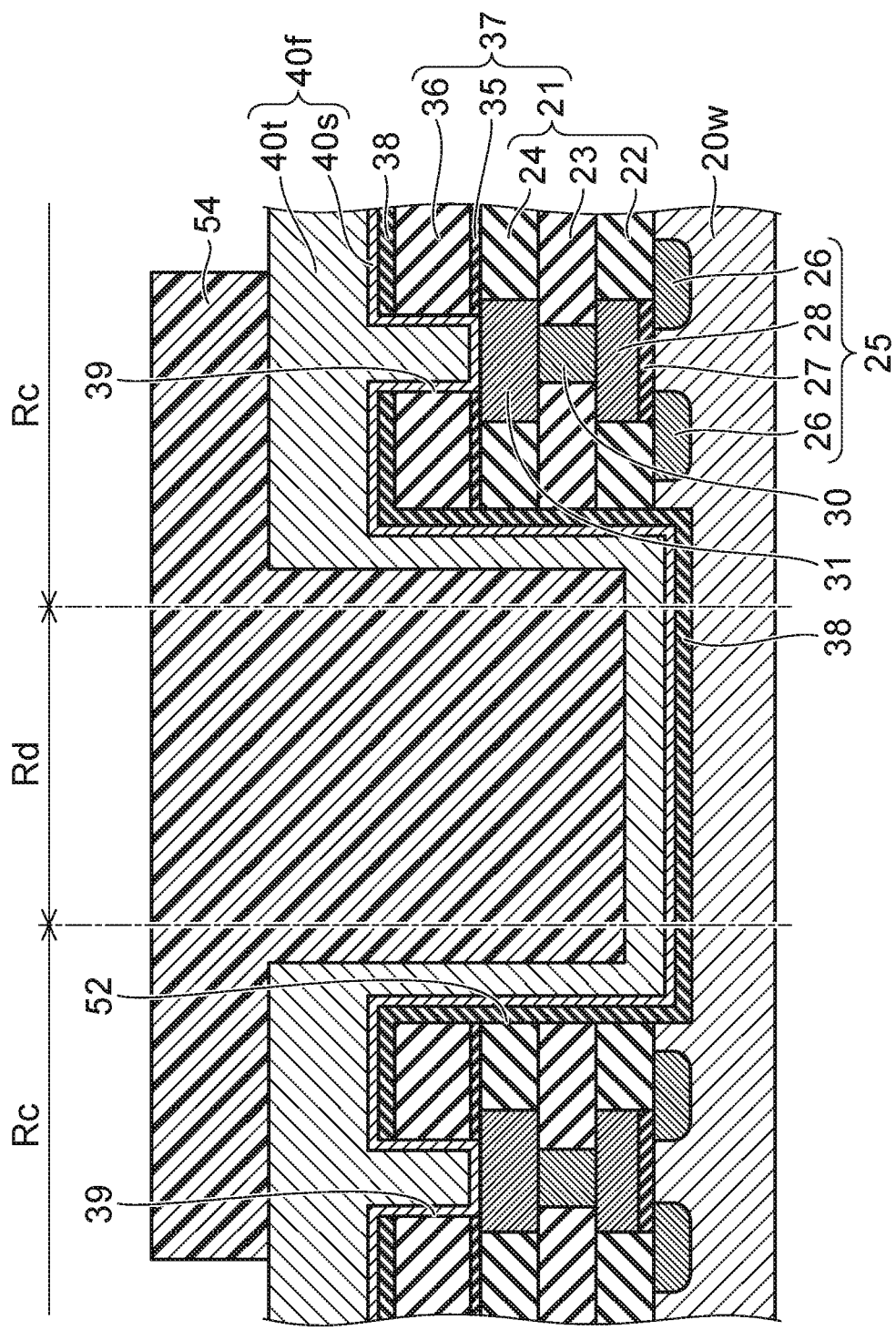

Continuing as shown in FIG. 12, a resist film 54 is formed in a region including the trench 52 and the region directly above the via hole 39. When viewed from above, the configuration of the resist film 54 is set to be a lattice configuration that is wider than the trench 52. The resist film 54 may be disposed locally in the interiors of the chip regions Rc as well.

Figure 13:
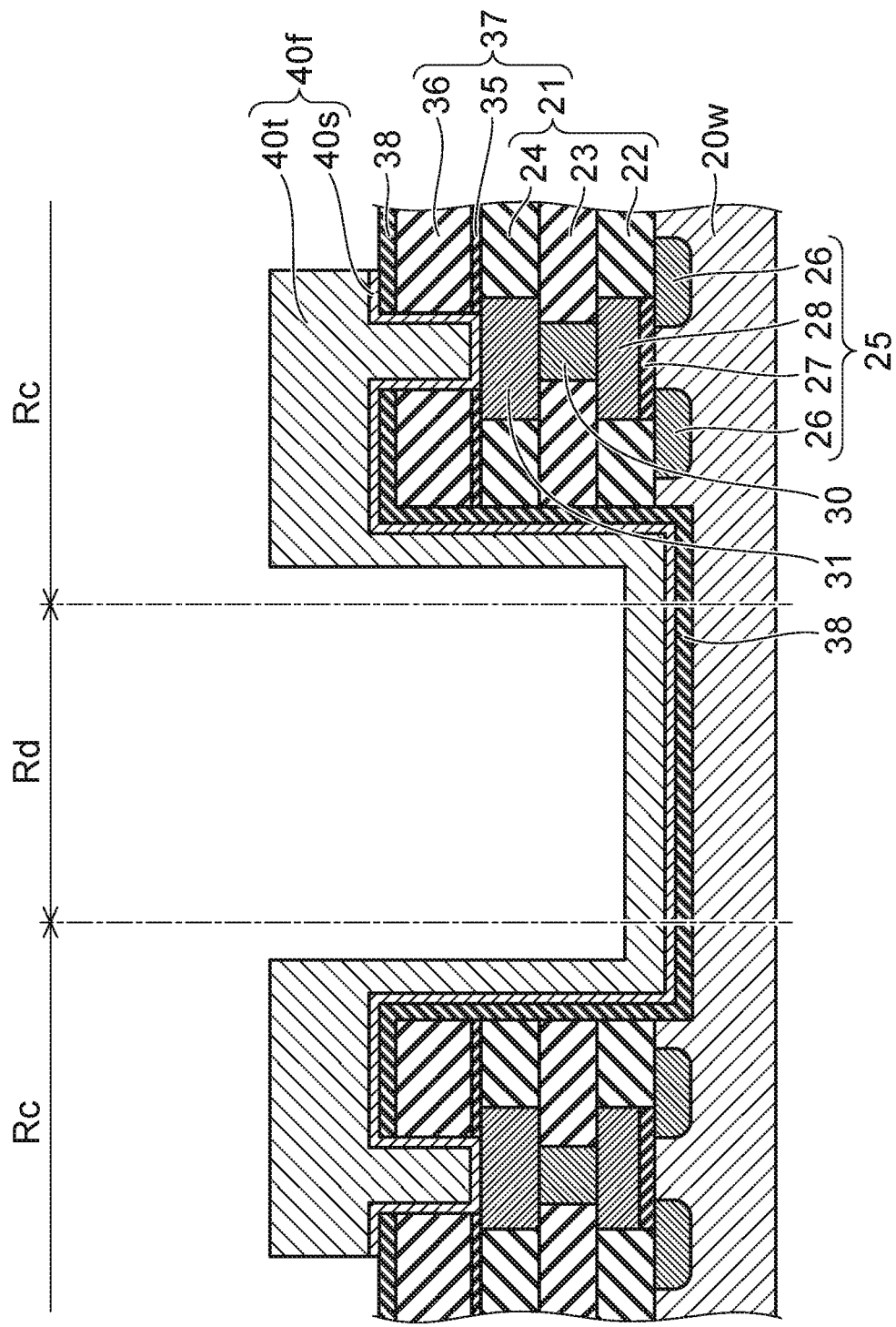

Then, as shown in FIG. 13, etching such as RIE or the like is performed using the resist film 54 (referring to FIG. 12) as a mask. Thereby, the metal film 40f is selectively removed; and the portion disposed in the region directly under the resist film 54 remains. Then, the resist film 54 is removed.

Figure 14:
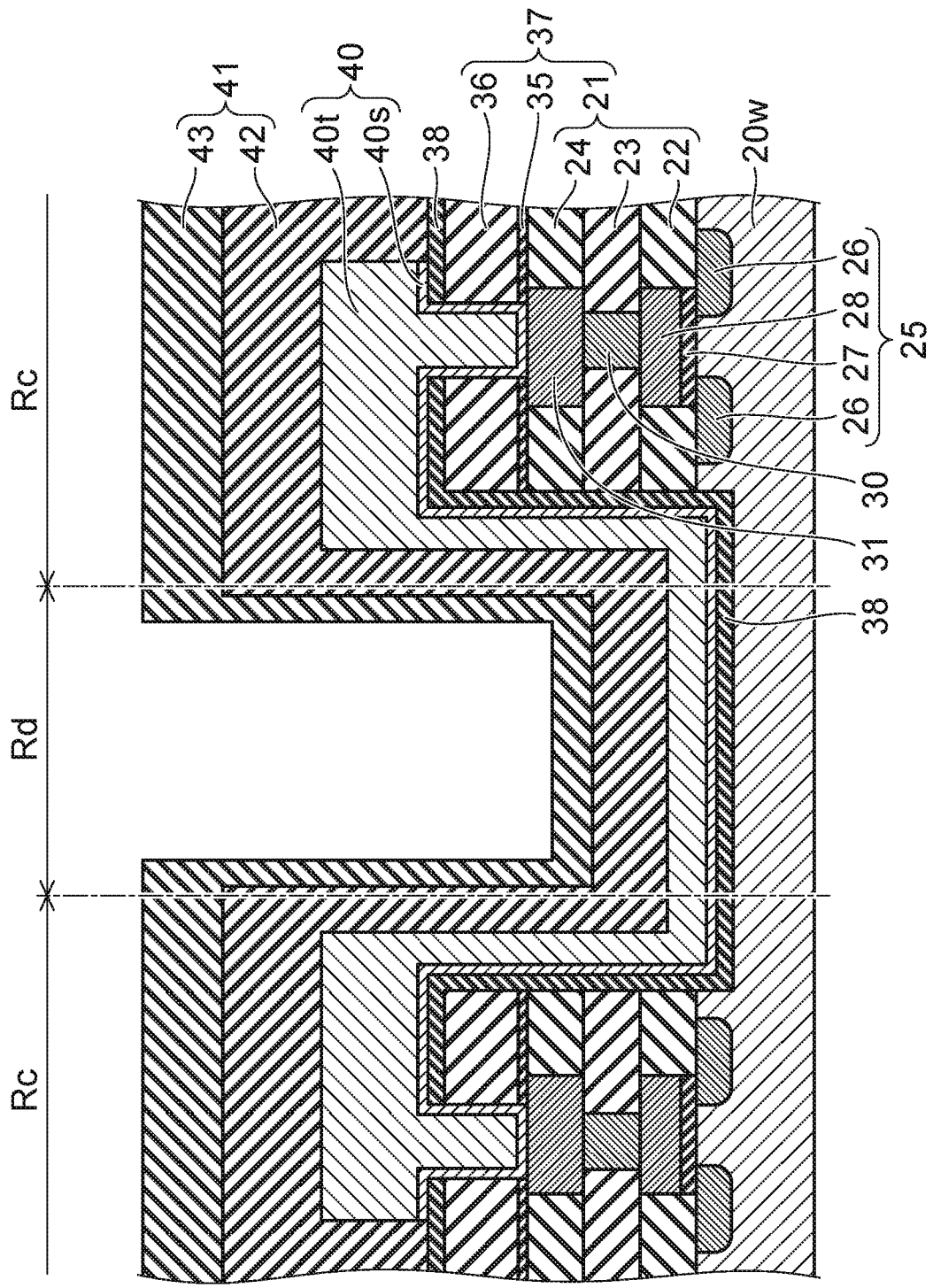

Continuing as shown in FIG. 14, the passivation film 41 is formed on the entire surface by depositing the silicon oxide film 42 and the silicon nitride film 43.

Figure 15:
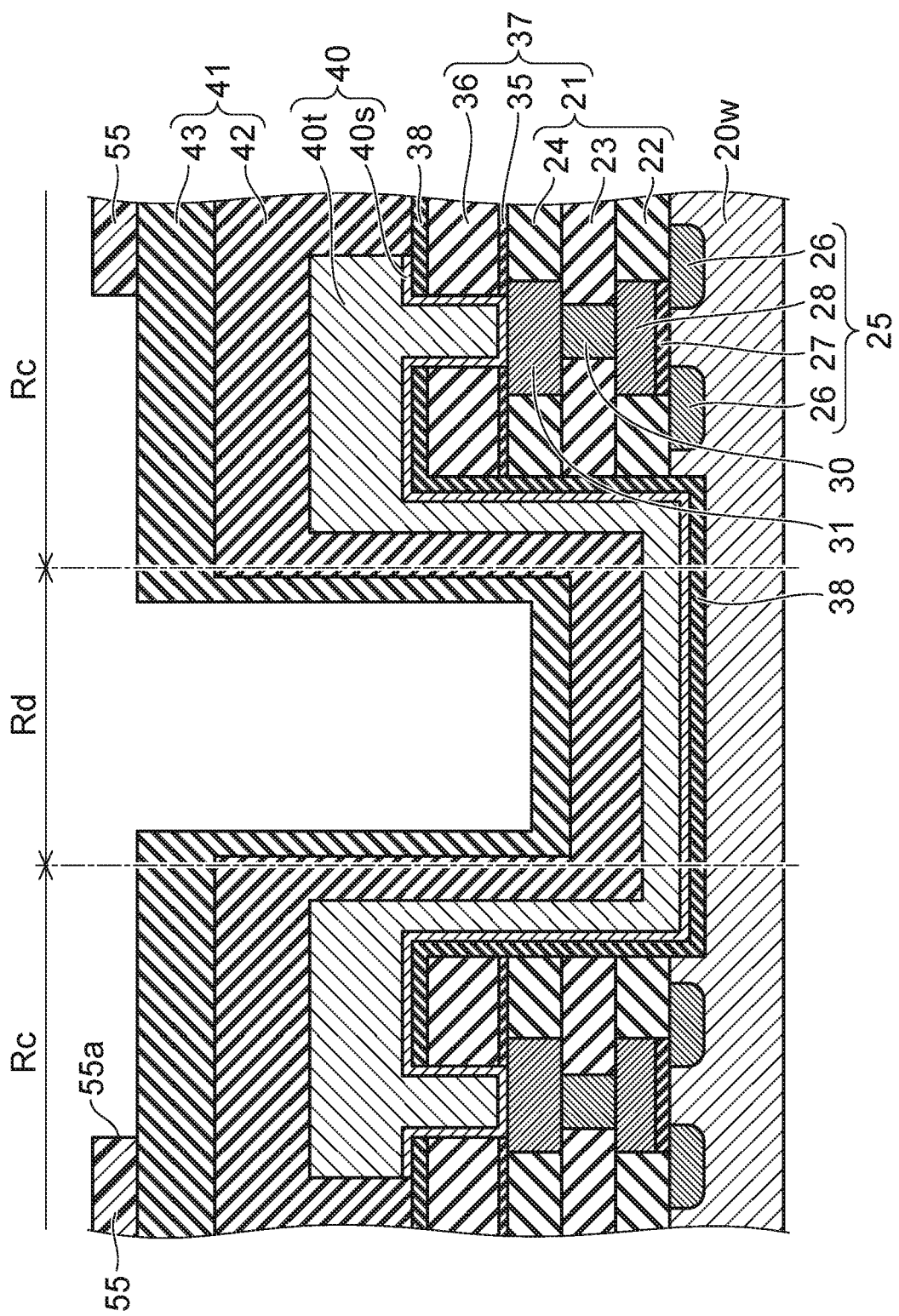

Then, a resist film 55 is formed as shown in FIG. 15. An opening 55a is formed in the region of the resist film 55 directly above the portion of the metal film 40f other than the end portion.

Figure 16:
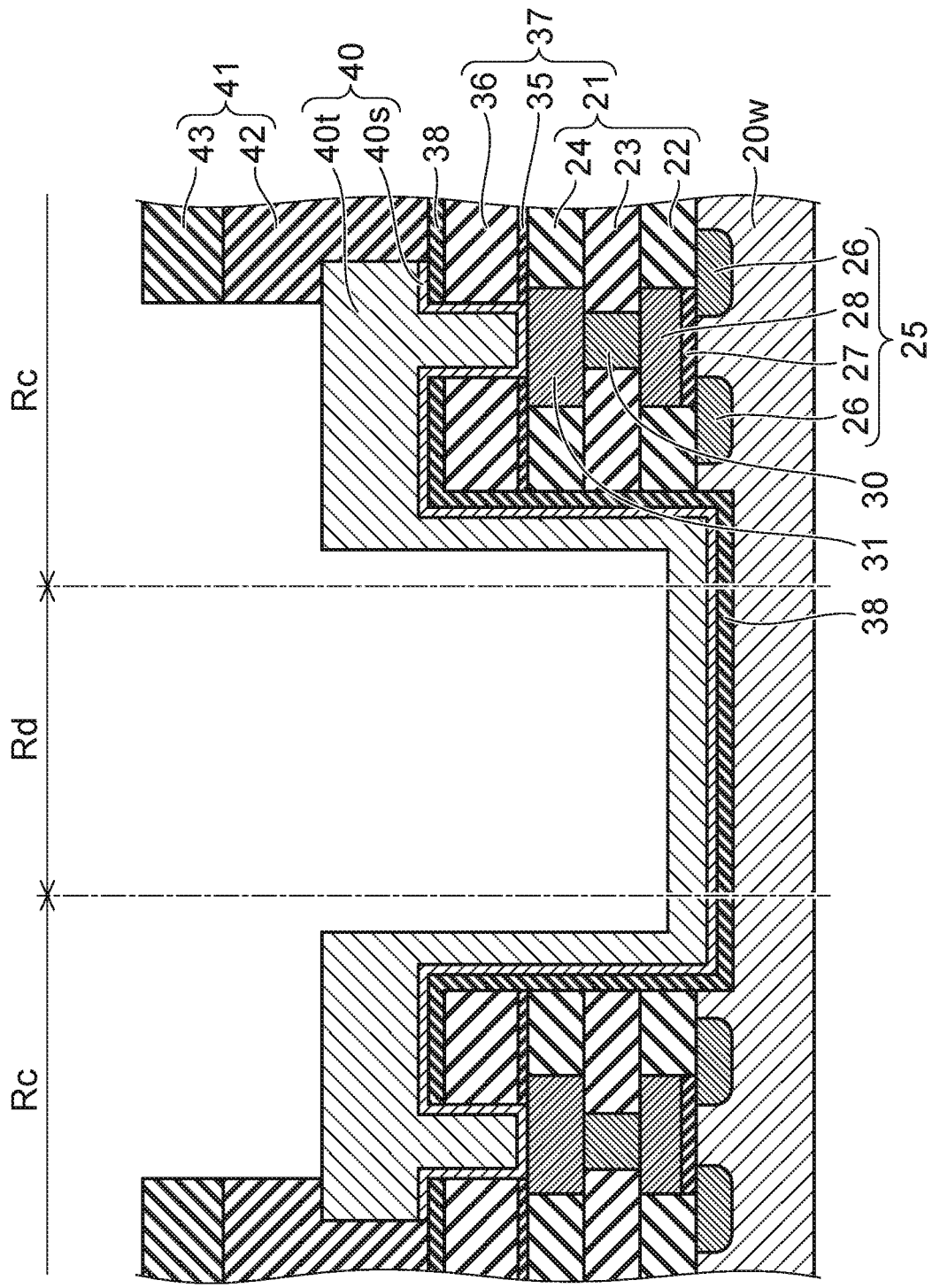

Continuing as shown in FIG. 16, the passivation film 41 is removed from the region directly under the opening 55a by performing etching such as RIE, etc., using the resist film 55 (referring to FIG. 15) as a mask. Then, the resist film 55 is removed.

Figure 17:
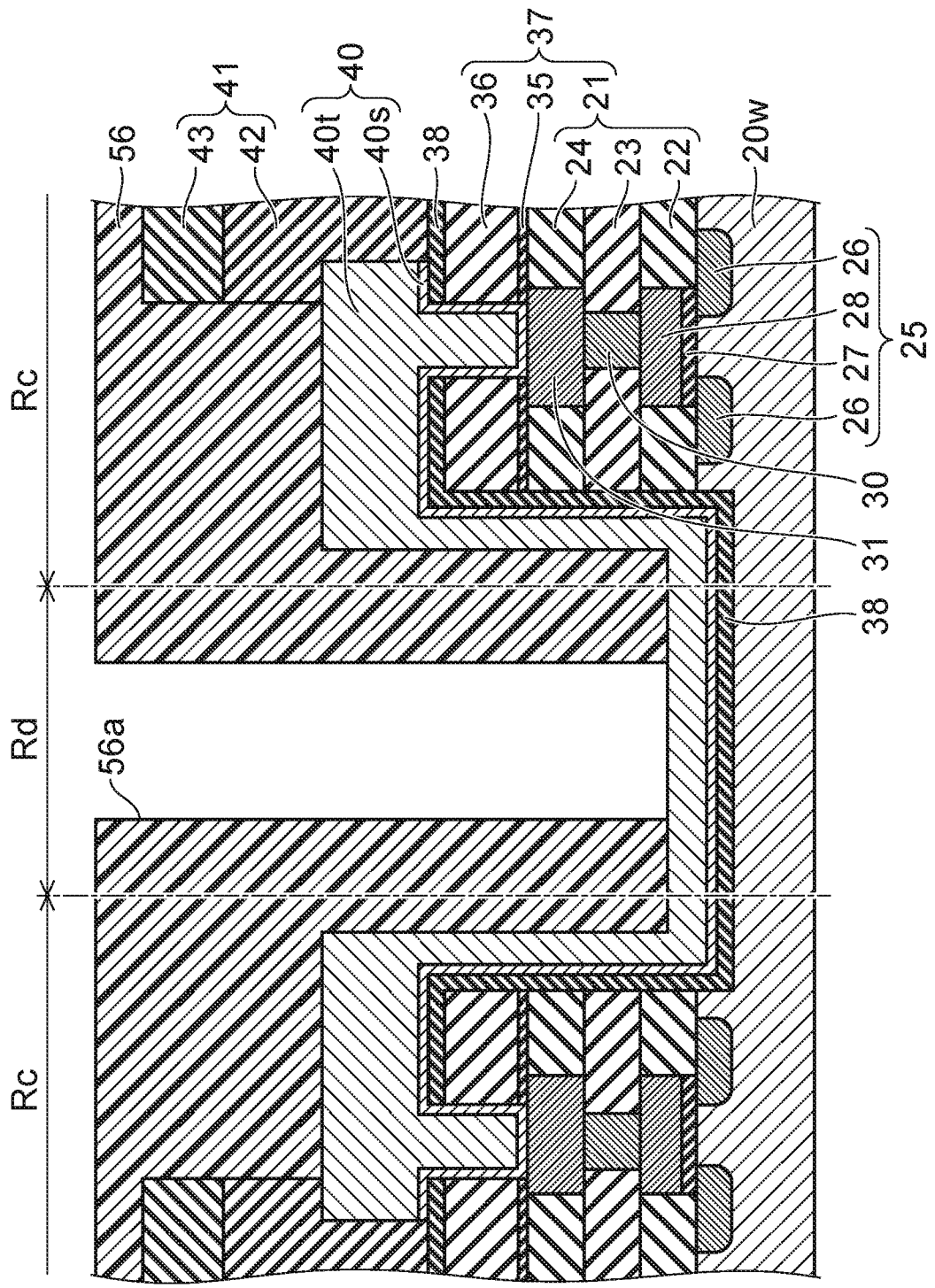

Then, a resist film 56 is formed as shown in FIG. 17. An opening 56a is formed in the resist film 56 at the central portion of the dicing region Rd. When viewed from above, the configuration of the opening 56a is set to be a lattice configuration that is finer than the trench 52.

Figure 18:
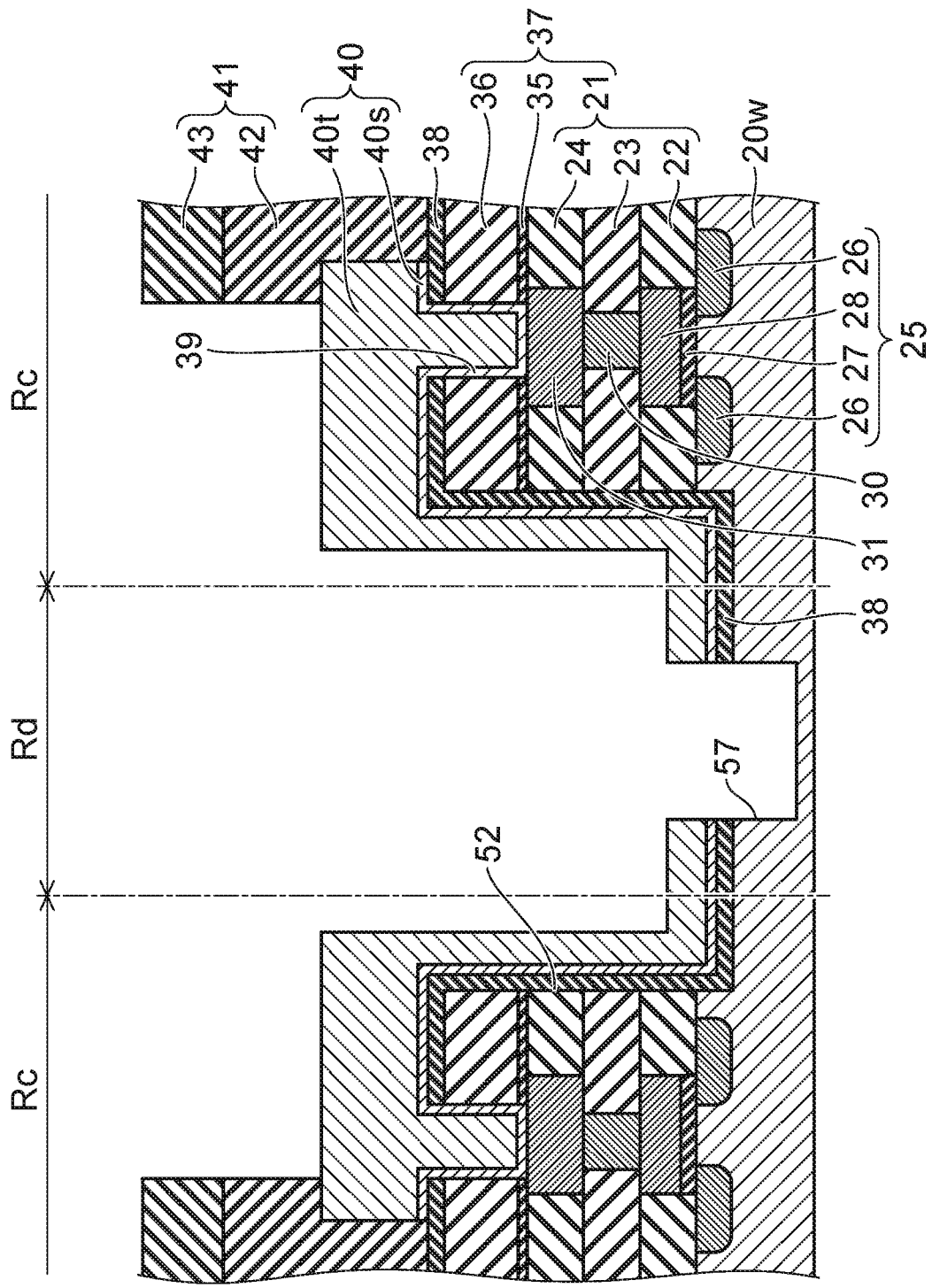

Continuing as shown in FIG. 18, a trench 57 is formed in the region directly under the opening 56a by performing anisotropic etching such as RIE, etc., using the resist film 56 (referring to FIG. 17) as a mask. The trench 57 is formed in the central portion of the bottom surface of the trench 52. The trench 57 pierces the metal film 40f and the insulating film 38 and enters the upper portion of the silicon wafer 20w. However, the trench 57 does not pierce through the silicon wafer 20w. Thereby, the metal film 40f is subdivided every chip region Rc to become the pads 40. Then, the resist film 56 is removed.

Figure 19:
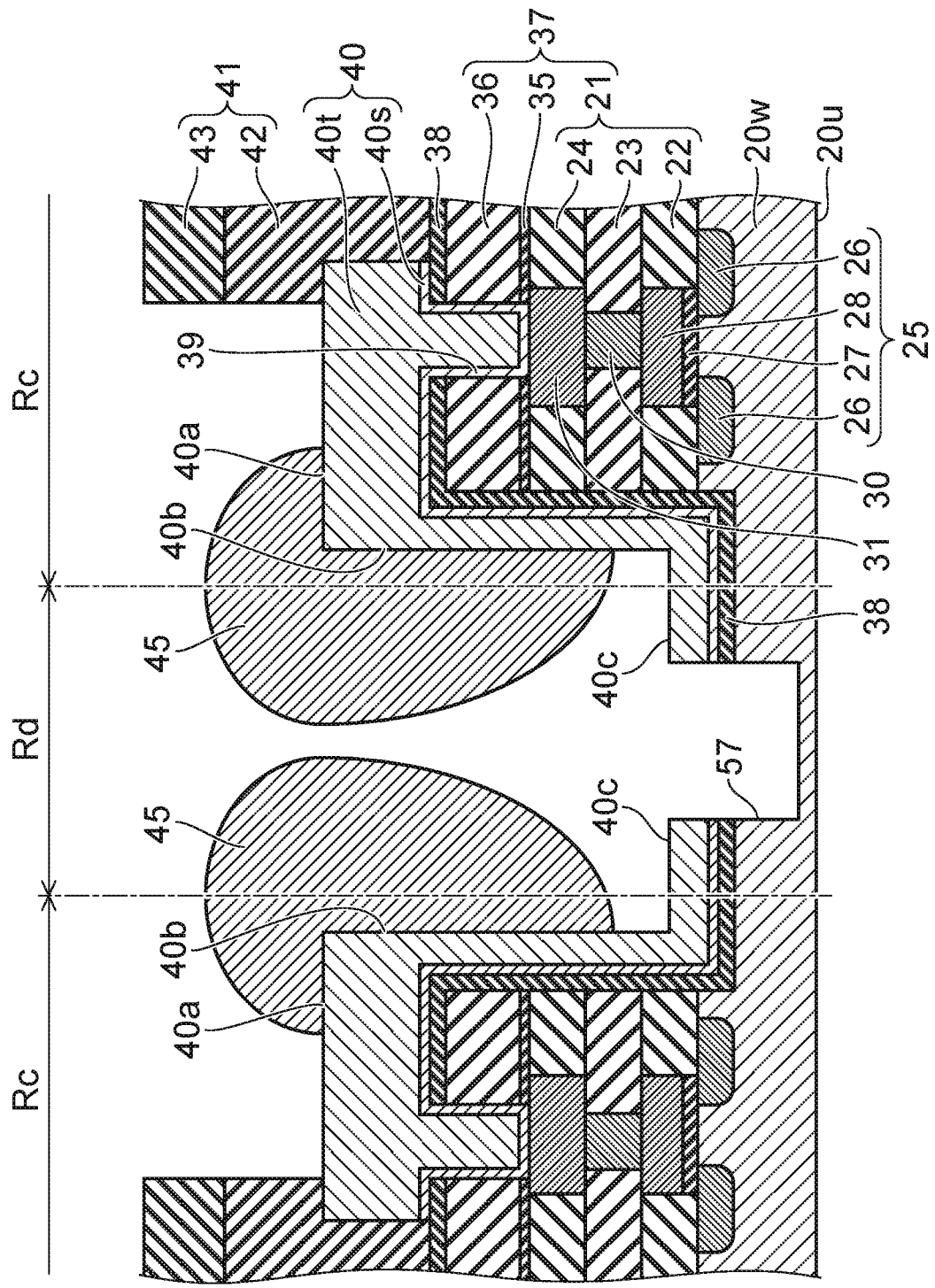

Then, as shown in FIG. 19, for example, the solder layers 45 are formed on the upper surfaces 40a and on the side surfaces 40b of the pads 40 by inkjet printing. The configurations of the solder layers 45 are set to be substantially hemispherical configurations and are disposed to catch on the corners between the upper surfaces 40a and the side surfaces 40b of the pads 40. Although the pair of solder layers 45 opposes each other with the trench 57 interposed, the pair of solder layers 45 does not contact each other. The solder layers 45 protrude toward the central portion of the trench 57 from the pads 40; and the tips of the protrusions of the solder layers 45 are disposed in the region directly above the trench 57. Thereby, the tips of the protrusions of the solder layers 45 are positioned further toward the center of the trench 57 than the end edges of the trench 57.

Figure 20:
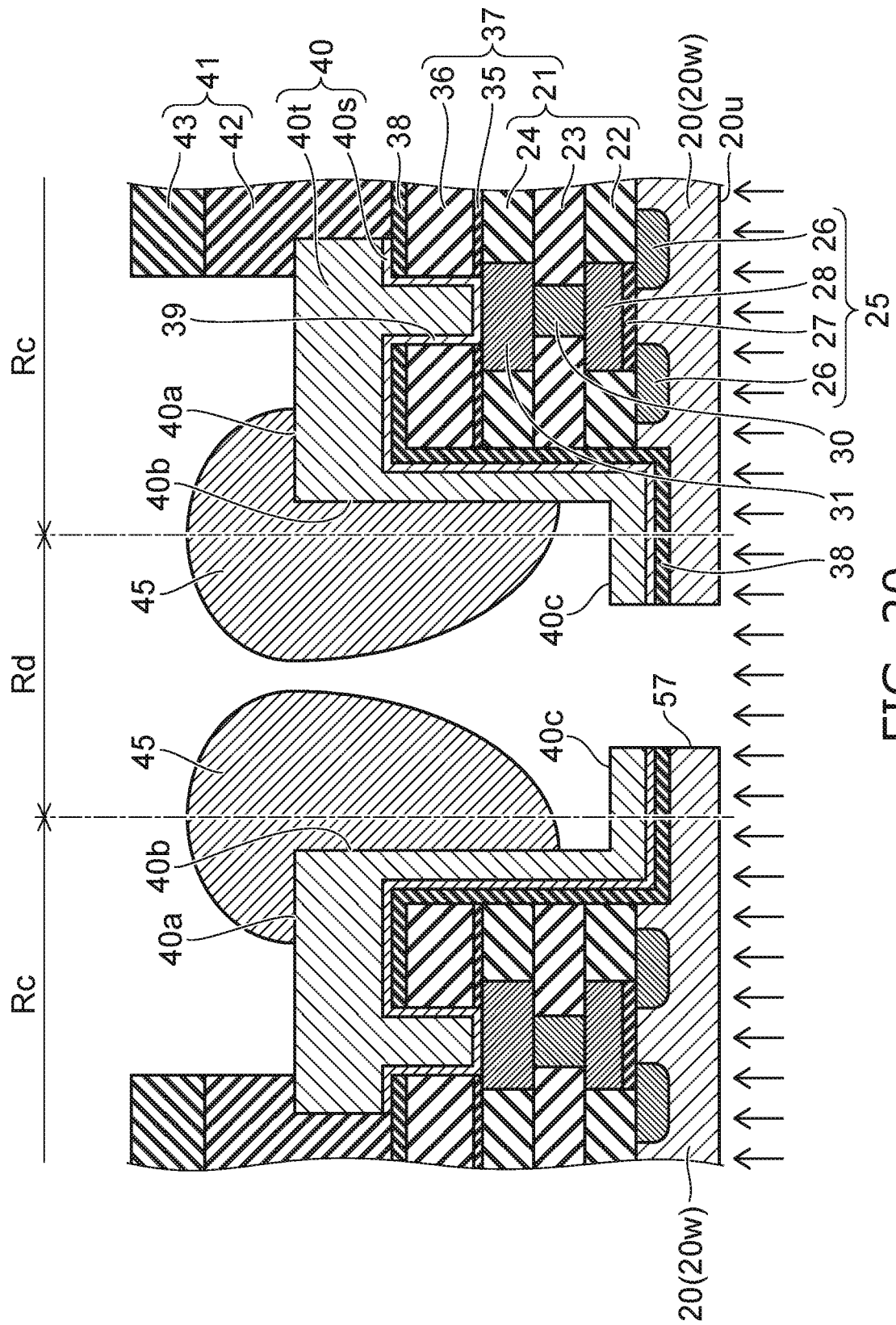

Continuing as shown in FIG. 20, for example, a lower surface 20u of the silicon wafer 20w is polished by laser irradiation or etching such as RIE, etc.; and the polishing surface is caused to reach the trench 57. Thereby, the silicon wafer 20w is subdivided every chip region Rc. As a result, the silicon wafer 20w is singulated into the multiple silicon substrates 20; and the semiconductor chips 10 are manufactured.

A method for manufacturing the integrated circuit device according to the embodiment will now be described.

Figure 21:
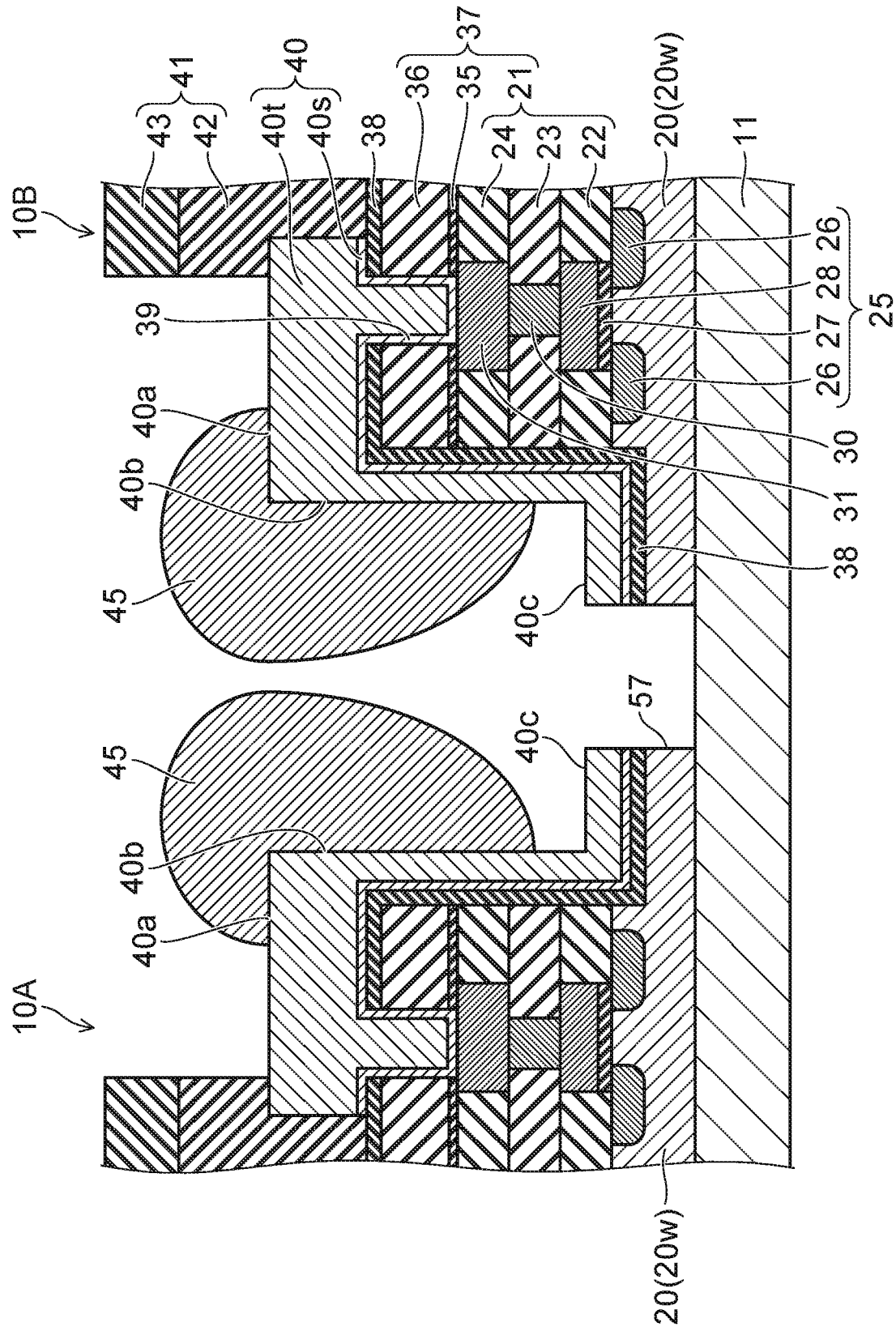
FIG. 21 is a cross-sectional view showing a method for manufacturing the integrated circuit device according to the embodiment.

FIG. 21 is a cross-sectional view showing the method for manufacturing the integrated circuit device according to the embodiment.

As shown in FIG. 21, the semiconductor chips 10A to 10C are mounted on the support substrate 11. Only the semiconductor chips 10A and 10B are shown in FIG. 21. At this time, the solder layers 45 of the mutually-adjacent semiconductor chips 10 are disposed to oppose each other. Although the semiconductor chips 10A to 10C each are manufactured by the processes shown in FIG. 5 to FIG. 20 described above, the semiconductor chips 10A to 10C are different types of semiconductor chips manufactured on mutually-different lines or at mutually-different times.

Then, as shown in FIG. 1 and FIG. 2, the structure body that is made of the support substrate 11 and the semiconductor chips 10A to 10C is placed in a reflow oven and heated. Thereby, the solder layers 45 melt; and the opposing pair of solder layers 45 contacts each other. Subsequently, by removing this structure body from the reflow oven, the mutually contacting pair of solder layers 45 is cooled and solidified to become one body as the connection member 12. Thereby, the mutually-opposing pads 40 of mutually-adjacent semiconductor chips 10 are connected via the connection members 12 made of solder. Thus, the integrated circuit device 1 according to the embodiment is manufactured.

Effects of the embodiment will now be described.

In the embodiment, the pads 40 are formed on the side surface of the semiconductor chip 10; the solder layers 45 are formed on the side surfaces of the pads 40; and the tips of the solder layers 45 protrude further sideward than the side surfaces of the silicon substrate 20 and the interconnect layer 21. Thereby, by mounting the multiple semiconductor chips 10 on the support substrate 11 and by once melting and solidifying the solder layers 45, the opposing pair of solder layers 45 becomes one body as the connection member 12; and the pads 40 of the mutually-adjacent semiconductor chips 10 can be connected to each other.

As a result, compared to the case of being connected by wire bonding, the distance between the semiconductor chips 10 can be short; and the integration of the integrated circuit device 1 can be increased. Also, compared to the case of being connected by wire bonding, the resistance can be reduced; and the operation speed of the entire integrated circuit device 1 can be increased. Compared to a TSV (Through Silicon Via) method in which the multiple semiconductor chips are overlaid and connected by through-vias, the integrated circuit device 1 can be manufactured at a low cost.

In the embodiment, the solder layers 45 are formed in the process shown in FIG. 19 before dicing the silicon wafer 20w in the process shown in FIG. 20. Therefore, the solder layers 45 can be formed collectively and easily by a method such as inkjet printing, etc. The silicon wafer 20w is singulated by forming the trench 57 in the silicon wafer 20w in the process shown in FIG. 18 and by causing the trench 57 to reach the polishing surface by polishing the lower surface 20u of the silicon wafer 20w in the process shown in FIG. 20. As a result, the contamination of the solder layers 45 can be suppressed because it is unnecessary to perform dicing using a blade when singulating the silicon wafer 20w.

According to the embodiment described above, a semiconductor chip, a method for manufacturing the semiconductor chip, an integrated circuit device, and a method for manufacturing the integrated circuit device can be realized in which increased speed and higher integration are possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor chip, comprising:
a semiconductor substrate;
a first interconnect layer provided on the semiconductor substrate;
a pad provided on a side surface of the first interconnect layer; and
a solder layer contacting a side surface of the pad and protruding further sideward than a side surface of the semiconductor substrate and a side surface of the first interconnect layer, the solder layer being disposed above an upper surface of the semiconductor substrate wherein,
the semiconductor substrate includes a protruding portion, the protruding portion protruding further sideward than the side surface of the first interconnect layer and being located under the solder layer,
the pad includes a lower portion disposed on the protruding portion of the semiconductor substrate, and
the solder layer is separated from the lower portion of the pad.

2. The semiconductor chip according to claim 1, wherein
the pad is disposed also on an upper surface of the first interconnect layer, and
the solder layer also contacts an upper surface of the pad.

3. The semiconductor chip according to claim 1, further comprising:
a second interconnect layer provided on the first interconnect layer, the second interconnect layer including a via; and
a third interconnect layer provided on the second interconnect layer, the third interconnect layer including an interconnect contacting the via, wherein
the first interconnect layer includes an interconnect contacting the via,
the pad is disposed also on a side surface of the second interconnect layer and on a side surface of the third interconnect layer.

4. The semiconductor chip according to claim 1, wherein a configuration of the solder layer is substantially hemispherical configurations.

5. An integrated circuit device, comprising:
a support substrate;
a first semiconductor chip and a second semiconductor chip provided on the support substrate; and
a connection member made of solder,
the first semiconductor chip and the second semiconductor chip each including
a semiconductor substrate,
a first interconnect layer provided on the semiconductor substrate, and
a pad provided on a side surface of the first interconnect layer,
the connection member contacting a side surface of the pad of the first semiconductor chip and a side surface of the pad of the second semiconductor chip, and
the connection member being disposed above an upper surface of the semiconductor substrate of the first semiconductor chip
wherein,
the semiconductor substrate includes a protruding portion, the protruding portion protruding further sideward than a side surface of the first interconnect layer and being located under the connection member,
the pad includes a lower portion disposed on the protruding portion of the semiconductor substrate, and
the connection member is separated from the lower portion of the pad.

6. The device according to claim 5, wherein
the pads are disposed also on upper surfaces of the first interconnect layers of the first semiconductor chip and the second semiconductor chip, and
the connection member also contacts an upper surface of the pad of the first semiconductor chip and an upper surface of the pad of the second semiconductor chip.

7. The device according to claim 5, wherein
the first semiconductor chip and the second semiconductor chip each further includes
a second interconnect layer provided on the first interconnect layer, the second interconnect layer including a via, and
a third interconnect layer provided on the second interconnect layer, the third interconnect layer including an interconnect contacting the via,
the first interconnect layer includes an interconnect contacting the via,
the pad is disposed also on a side surface of the second interconnect layer and on a side surface of the third interconnect layer.

8. The device according to claim 5, wherein the connection member includes a constricted portion between a first portion and a second portion, the first portion contacting the pad of the first semiconductor chip, and the second portion contacting the pad of the second semiconductor chip.

* * * * *